(12) United States Patent
Hotelling et al.

(10) Patent No.: US 8,031,094 B2
(45) Date of Patent: Oct. 4, 2011

(54) TOUCH CONTROLLER WITH IMPROVED ANALOG FRONT END

(75) Inventors: Steven Porter Hotelling, San Jose, CA (US); Christoph Horst Krah, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 92 days.

(21) Appl. No.: 12/558,374

(22) Filed: Sep. 11, 2009

(65) Prior Publication Data

US 2011/0063154 A1    Mar. 17, 2011

(51) Int. Cl.
*H03M 3/00* (2006.01)
*G06F 3/041* (2006.01)

(52) U.S. Cl. .................. 341/143; 341/139; 345/173
(58) Field of Classification Search ............ 341/143, 341/139; 345/173, 174
See application file for complete search history.

(56) References Cited

U.S. PATENT DOCUMENTS

| | | | |
|---|---|---|---|
| 5,183,040 A * | 2/1993 | Nappholz et al. ................ 607/4 |
| 5,359,156 A * | 10/1994 | Chan et al. ................... 345/173 |
| 5,483,261 A | 1/1996 | Yasutake |
| 5,488,204 A | 1/1996 | Mead et al. |
| 5,796,389 A * | 8/1998 | Bertram et al. ............. 345/173 |
| 5,825,352 A | 10/1998 | Bisset et al. |
| 5,835,079 A | 11/1998 | Shieh |
| 5,880,411 A | 3/1999 | Gillespie et al. |
| 6,161,042 A * | 12/2000 | Hartley et al. ................ 607/20 |
| 6,188,391 B1 | 2/2001 | Seely et al. |
| 6,310,610 B1 | 10/2001 | Beaton et al. |
| 6,323,846 B1 | 11/2001 | Westerman et al. |
| 6,535,147 B1 * | 3/2003 | Masters et al. ................ 345/177 |
| 6,690,387 B2 | 2/2004 | Zimmerman et al. |
| 6,967,606 B2 * | 11/2005 | Wiesbauer et al. ........... 341/143 |
| 7,015,894 B2 | 3/2006 | Morohoshi |
| 7,184,064 B2 | 2/2007 | Zimmerman et al. |
| 7,663,607 B2 | 2/2010 | Hotelling et al. |
| 2006/0026521 A1 | 2/2006 | Hotelling et al. |
| 2006/0097991 A1 | 5/2006 | Hotelling et al. |
| 2006/0197753 A1 | 9/2006 | Hotelling |
| 2007/0257890 A1 * | 11/2007 | Hotelling et al. ............. 345/173 |
| 2008/0158175 A1 * | 7/2008 | Hotelling et al. ............. 345/173 |

(Continued)

FOREIGN PATENT DOCUMENTS

JP    2000-163031 A    6/2000

(Continued)

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Howard Williams
(74) *Attorney, Agent, or Firm* — Morrison & Foerster LLP

(57) ABSTRACT

A controller for a touch sensor includes a transimpedance amplifier, and a feedback resistor coupled to an input of the transimpedance amplifier and to an output of the transimpedance amplifier. At least one multiplexor may be coupled to the input of the transimpedance amplifier and configured to multiplex a plurality of analog inputs to one dedicated channel. The controller may further include a bandpass filter coupled to the output of the transimpedance amplifier. The output of the bandpass filter may be input to an anti-aliasing filter, which feeds into an analog to digital converter. Alternatively, the output of the bandpass filter may be input to a sigma-delta analog to digital converter.

28 Claims, 11 Drawing Sheets

U.S. PATENT DOCUMENTS

2010/0059295 A1 3/2010 Hotelling et al.
2010/0085325 A1* 4/2010 King-Smith et al. ......... 345/174

FOREIGN PATENT DOCUMENTS

JP 2002-342033 A 11/2002

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

TOUCH CONTROLLER WITH IMPROVED ANALOG FRONT END

FIELD

This relates generally to touch sensor panels, and in particular, to touch controllers with improved analog front ends.

BACKGROUND

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location dictated by a user interface (UI) being displayed by the display device. In general, touch screens can recognize a touch event and the position of the touch event on the touch sensor panel, and the computing system can then interpret the touch event in accordance with the display appearing at the time of the touch event, and thereafter can perform one or more actions based on the touch event.

Mutual capacitance touch sensor panels can be formed from a matrix of drive and sense lines of a substantially transparent conductive material such as Indium Tim Oxide (ITO), often arranged in rows and columns in horizontal and vertical directions on a substantially transparent substrate. Drive signals can be transmitted through the drive lines, which can result in the formation of static mutual capacitance at the crossover points (sensing pixels) of the drive lines and the sense lines. The static mutual capacitance, and any changes to the static mutual capacitance due to a touch event, can be determined from sense signals that can be generated in the sense lines due to the drive signals.

SUMMARY

This relates to a touch controller for a touch sensor panel that can have improved charge handling capability, noise immunity, and a smaller footprint. The touch controller can include a transimpedance amplifier in its analog front end for receiving a sense signal from a touch sensor panel, with a feedback resistor coupled to an input of the transimpedance amplifier and to an output of the transimpedance amplifier. The transimpedance amplifier can provide improved noise attenuation in the analog front end, while consuming less DIE real estate, as compared to a charge amplifier with capacitive feedback. The gain of the transimpedance amplifier can be programmable via a programmable feedback resister. At least one multiplexor may be coupled to the input of the transimpedance amplifier and configured to multiplex a plurality of analog inputs to one dedicated channel, in order to consume even less DIE real-estate.

The analog front end can further include a bandpass filter coupled to the output of the transimpedance amplifier. The bandpass filter can increase available noise headroom in the output of the transimpedance amplifier. The center frequency of the bandpass filter can be programmable. The output of the bandpass filter can be input to an anti-aliasing filter, which feeds into an analog to digital converter. The cutoff frequency of the anti-aliasing filter can be programmable. Alternatively, the output of the bandpass filter can be input directly to a sigma-delta analog to digital converter, in which case the anti-aliasing filter may be unnecessary.

An alternate embodiment is directed to an analog front end for a touch sensor, which can include a pre-amplifier, with a feedback resistor coupled to an input of the pre-amplifier, an output of the pre-amplifier and a virtual ground. The controller can further include at least one capacitor coupled to the input of the pre-amplifier and the virtual ground, and a sigma-delta analog to digital converter coupled to the output of the pre-amplifier.

Yet another embodiment is directed to an analog front end for a touch sensor, which can include a pre-amplifier, the input of which can be coupled to a virtual ground; and a sigma-delta analog to digital converter can be coupled to the output of the pre-amplifier. The sigma-delta analog to digital converter can have band-pass filter response and can have one or more feedback paths from the sigma-delta converter to the pre-amplifiers input which can be held at virtual ground. The center frequency of the sigma-delta delta converter's integrated bandpass filter can be programmable.

Yet another embodiment is directed to an analog front end for a touch sensor which can include a biquad bandpass filter, whose input can be held at virtual ground; and a sigma delta analog to digital converter can be coupled to the output of the biquad bandpass filter. The biquad bandpass filter can have a programmable center frequency.

Yet another embodiment is directed to an analog front end for a touch sensor which can include a biquad bandpass filter, whose input can be held at virtual ground; and an anti-aliasing filter can be coupled to the output of the biquad band-pass filter and the output of the anti-aliasing filter can be coupled the output of an analog to digital converter. The analog to digital converter can be a successive approximation or pipeline analog to digital converter. The anti-aliasing filter can have a programmable cut-off frequency.

BRIEF DESCRIPTION OF THE DRAWINGS

The present disclosure, in accordance with one or more various embodiments, is described in detail with reference to the following figures. The drawings are provided for purposes of illustration only and merely depict exemplary embodiments of the disclosure. These drawings are provided to facilitate the reader's understanding of the disclosure and should not be considered limiting of the breadth, scope, or applicability of the disclosure. It should be noted that for clarity and ease of illustration these drawings are not necessarily made to scale.

DETAILED DESCRIPTION

In the following description of embodiments, reference is made to the accompanying drawings which form a part hereof, and in which it is shown by way of illustration specific embodiments that can be practiced. It is to be understood that other embodiments can be used and structural changes can be made without departing from the scope of the disclosed embodiments.

This relates to a touch controller for a touch sensor panel that can have improved charge handling capability, noise immunity, and a smaller footprint. The touch controller can include a transimpedance amplifier in its analog front end for receiving a sense signal from a touch sensor panel, with a programmable feedback resistor coupled to an input of the transimpedance amplifier and to an output of the transimpedance amplifier. At least one multiplexor can be coupled to the input of the transimpedance amplifier and configured to multiplex a plurality of analog inputs to one dedicated channel. The controller can further include a bandpass filter coupled to the output of the transimpedance amplifier. The output of the bandpass filter can be input to an anti-aliasing filter, which feeds into an analog to digital converter. Alternatively, the output of the bandpass filter can be input to a sigma-delta analog to digital converter.

It should be understood that the various embodiments can be applicable to both mutual and self-capacitance sensor panels, single and multi-touch sensor panels, and other sensors in which multiple simultaneous stimulation signals are used to generate a composite sense signal. Furthermore, it should be understood that various embodiments can also be applicable to various touch sensor panel configurations, such as configurations in which the drive and sense lines are formed in non-orthogonal arrangements, on the back of a cover glass, on the same side of a single substrate, or integrated with display circuitry.

Figure 1:
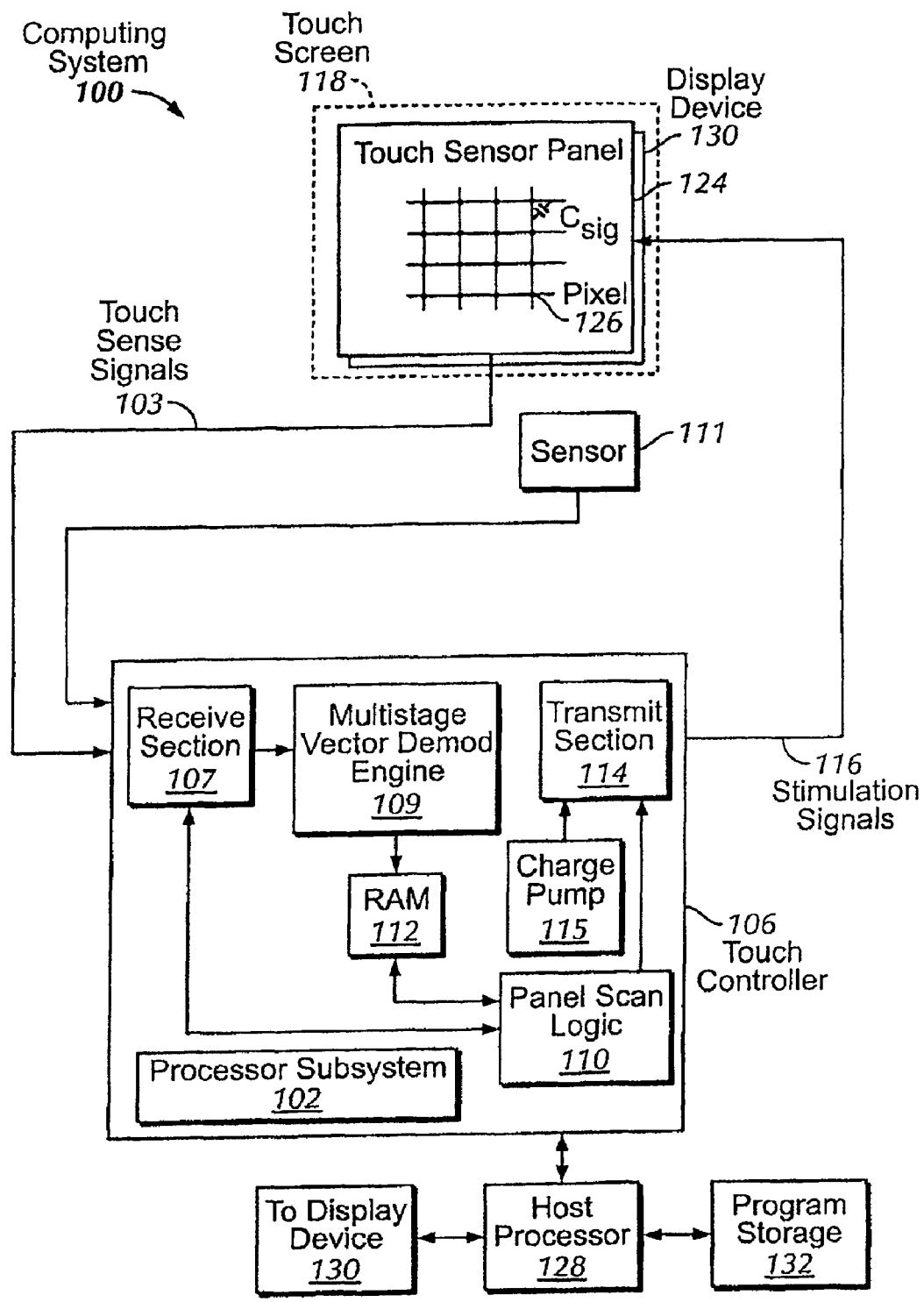
FIG. 1 illustrates an example computing system according to various embodiments.

FIG. 1 illustrates example computing system 100 that can utilize touch controller 106 with integrated drive system according to various embodiments. Touch controller 106 can be a single application specific integrated circuit (ASIC) that can include one or more processor subsystems 102, which can include, for example, one or more main processors, such as ARM968 processors or other processors with similar functionality and capabilities. However, in other embodiments, the processor functionality can be implemented instead by dedicated logic, such as a state machine. Processor subsystems 102 can also include, for example, peripherals (not shown) such as random access memory (RAM) or other types of memory or storage, watchdog timers and the like. Touch controller 106 can also include, for example, receive section 107 for receiving signals, such as touch sense signals 103 from the sense lines of touch sensor panel 124, other signals from other sensors such as sensor 111, etc. Touch controller 106 can also include, for example, a demodulation section such as multistage vector demod engine 109, panel scan logic 110, and a drive system including, for example, transmit section 114. Panel scan logic 110 can access RAM 112, autonomously read data from the sense channels and provide control for the sense channels. In addition, panel scan logic 110 can control transmit section 114 to generate stimulation signals 116 at various frequencies and phases that can be selectively applied to the drive lines of touch sensor panel 124.

Charge pump 115 can be used to generate the supply voltage for the transmit section. Stimulation signals 116 (Vstim) can have amplitudes higher than the maximum voltage the ASIC process can tolerate by cascoding transistors. Therefore, using charge pump 115, the stimulus voltage can be higher (e.g. 6V) than the voltage level a single transistor can handle (e.g. 3.6V). Although FIG. 1 shows charge pump 115 separate from transmit section 114, the charge pump can be part of the transmit section.

Touch sensor panel 124 can include a capacitive sensing medium having a plurality of drive lines and a plurality of sense lines. The drive and sense lines can be formed from a transparent conductive medium such as Indium Tin Oxide (ITO) or Antimony Tin Oxide (ATO), although other transparent and non-transparent materials such as copper can also be used. In some embodiments, the drive and sense lines can be perpendicular to each other, although in other embodiments other non-Cartesian orientations are possible. For example, in a polar coordinate system, the sensing lines can be concentric circles and the driving lines can be radially extending lines (or vice versa). It should be understood, therefore, that the terms "drive lines" and "sense lines" as used herein are intended to encompass not only orthogonal grids, but the intersecting traces of other geometric configurations having first and second dimensions (e.g. the concentric and radial lines of a polar-coordinate arrangement). The drive and sense lines can be formed on, for example, a single side of a substantially transparent substrate, opposite sides of the same substrate, or on two different substrates.

At the "intersections" of the traces, where the drive and sense lines can pass adjacent to and above and/or below (cross) each other (but without making direct electrical contact with each other), the drive and sense lines can essentially form two electrodes (although more than two traces could intersect as well). Each intersection of drive and sense lines can represent a capacitive sensing node and can be viewed as picture element (pixel) 126, which can be particularly useful when touch sensor panel 124 is viewed as capturing an "image" of touch. (In other words, after touch controller 106 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) The capacitance between drive and sense electrodes can appear as a stray capacitance when the given row is held at direct current (DC) voltage levels and as a mutual signal capacitance Csig when the given row is stimulated with an alternating current (AC) signal. The presence of a finger or other object near or on the touch sensor panel can be detected by measuring changes to a signal charge Qsig present at the pixels being touched, which is a function of Csig.

Computing system 100 can also include host processor 128 for receiving outputs from processor subsystems 102 and performing actions based on the outputs that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 128 can also perform additional functions that may not be related to panel processing, and can be coupled to program storage 132 and display device 130 such as an LCD display for providing a UI to a user of the device. In some embodiments, host processor 128 can be a separate component from touch controller 106, as shown. In other embodiments, host processor 128 can be included as part of touch controller 106. In still other embodiments, the functions of host processor 128 can be performed by processor subsystem 102 and/or distributed among other components of touch controller 106. Display device 130 together with touch sensor panel 124, when located partially or entirely under the touch sensor panel, can form touch screen 118.

Note that one or more of the functions described above can be performed, for example, by firmware stored in memory (e.g., one of the peripherals) and executed by processor subsystem 102, or stored in program storage 132 and executed by host processor 128. The firmware can also be stored and/or transported within any computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable storage medium" can be any medium that can contain or store the program for use by or in connection with the instruction execution system, apparatus, or device. The computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

Figure 2A:
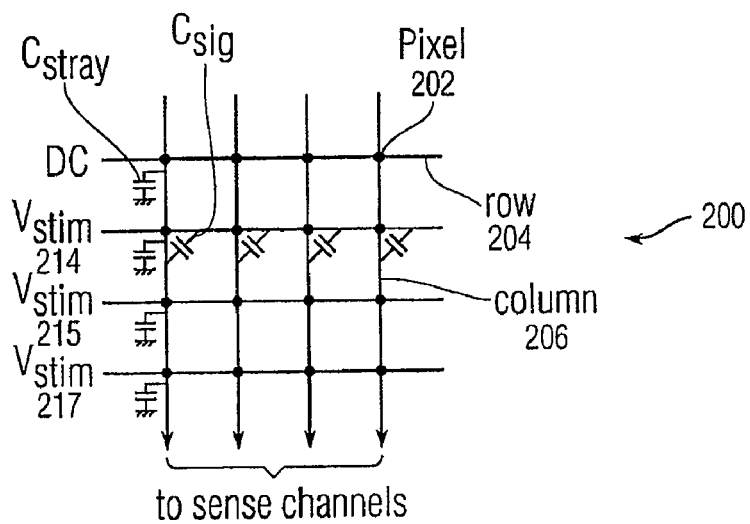
FIG. 2a illustrates an exemplary mutual capacitance touch sensor panel according to various embodiments.

FIG. 2a illustrates exemplary mutual capacitance touch sensor panel 200 according to an embodiment of the present disclosure. FIG. 2a indicates the presence of a stray capacitance Cstray at each pixel 202 located at the intersection of a row 204 and a column 206 trace (although Cstray for only one column is illustrated in FIG. 2a for purposes of simplifying the figure). In the example of FIG. 2a, AC stimuli Vstim 214, Vstim 215 and Vstim 217 can be applied to several rows, while other rows can be connected to DC. Vstim 214, Vstim 215 and Vstim 217 can be at different frequencies and phases, as will be explained later. Each stimulation signal on a row can cause a charge Qsig=Csig×Vstim to be injected into the columns through the mutual capacitance present at the affected pixels. A change in the injected charge (Qsig_sense) can be detected when a finger, palm or other object is present at one or more of the affected pixels. Vstim signals 214, 215 and 217 can include one or more bursts of sine waves. Note that although FIG. 2a illustrates rows 204 and columns 206 as being substantially perpendicular, they need not be so aligned, as described above. As described above, each column 206 can be connected to a sense channel (see sense channels 108 in FIG. 1).

Figure 2B:
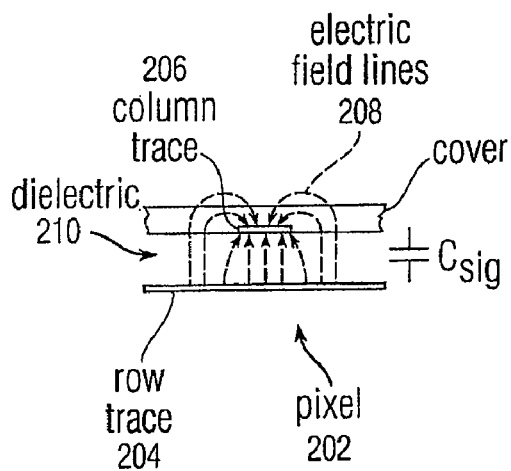
FIG. 2b is a side view of an exemplary pixel in a steady-state (no-touch) condition according to various embodiments.

FIG. 2b is a side view of exemplary pixel 202 in a steady-state (no-touch) condition according to various embodiments. In FIG. 2b, an electric field of electric field lines 208 of the mutual capacitance between column 206 and row 204 traces or electrodes separated by dielectric 210 is shown.

Figure 2C:
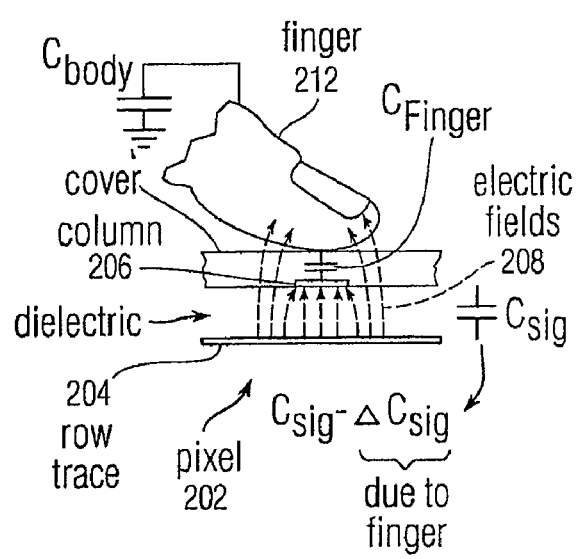
FIG. 2c is a side view of an exemplary pixel in a dynamic (touch) condition according to various embodiments.

FIG. 2c is a side view of exemplary pixel 202 in a dynamic (touch) condition. In FIG. 2c, finger 212 has been placed near pixel 202. Finger 212 can be a low-impedance object at signal frequencies, and can have an AC capacitance Cfinger from the column trace 204 to the body. The body can have a self-capacitance to ground Cbody of about 200 pF, where Cbody is much larger than Cfinger. If finger 212 blocks some electric field lines 208 between the row and column electrodes (those fringing fields that exit the dielectric and pass through the air above the row electrode), those electric field lines can be shunted to ground through the capacitance path inherent in the finger and the body, and as a result, the steady state signal capacitance Csig can be reduced by ΔCsig. In other words, the combined body and finger capacitance can act to reduce Csig by an amount ΔCsig (which can also be referred to herein as Csig_sense), and can act as a shunt or dynamic return path to ground, blocking some of the electric fields as resulting in a reduced net signal capacitance. The signal capacitance at the pixel can become Csig−ΔCsig, where Csig represents the static (no touch) component and ΔCsig represents the dynamic (touch) component. Note that Csig−ΔCsig may always be nonzero due to the inability of a finger, palm or other object to block all electric fields, especially those electric fields that remain entirely within the dielectric material. In addition, it should be understood that as a finger is pushed harder or more completely onto the multi-touch panel, the finger can tend to flatten, blocking more and more of the electric fields, and thus ΔCsig can be variable and representative of how completely the finger is pushing down on the panel (i.e. a range from "no-touch" to "full-touch").

Figure 3:
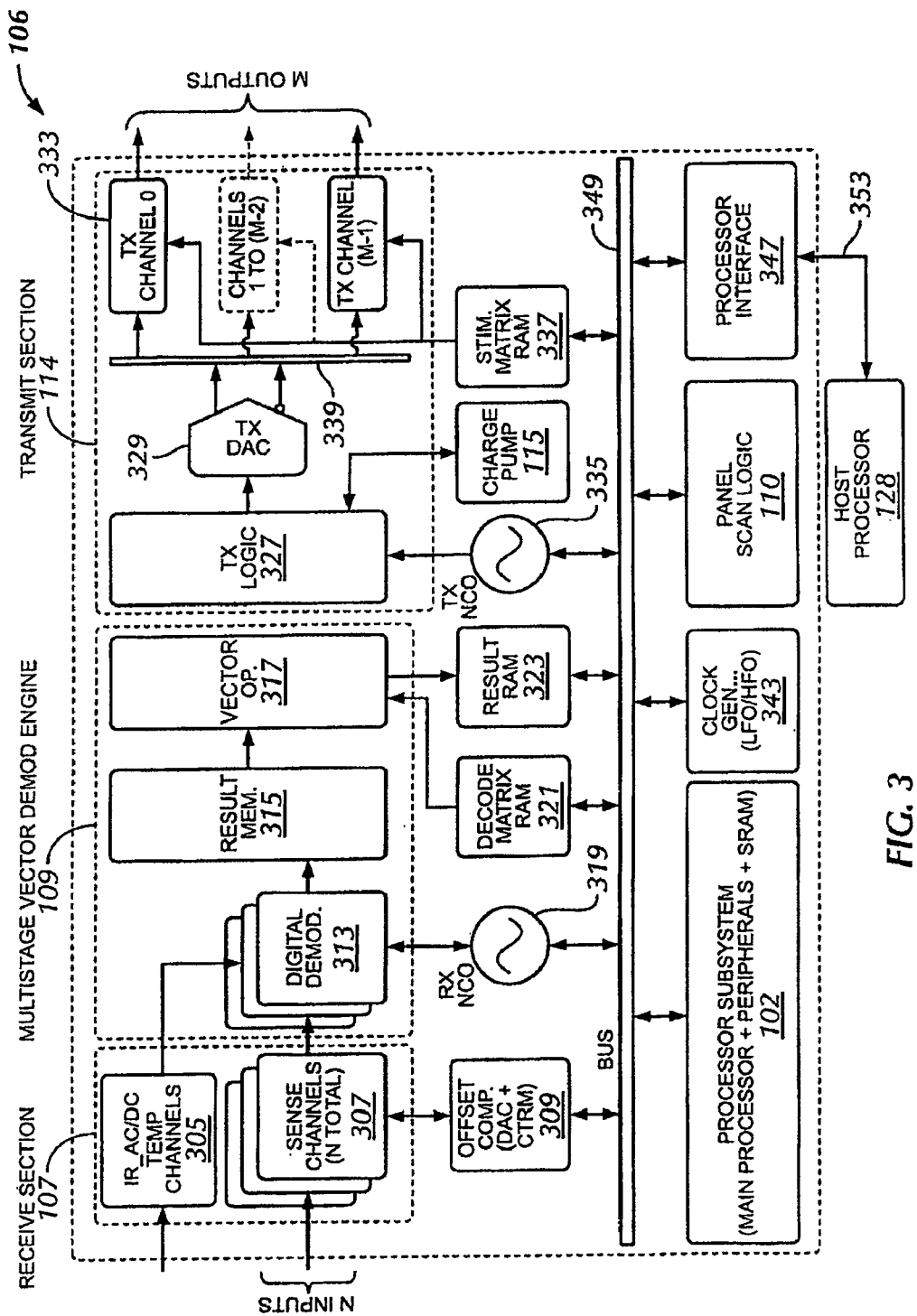
FIG. 3 illustrates an example application-specific integrated circuit (ASIC) single chip multi-touch controller according to various embodiments.

FIG. 3 is a more detailed block diagram of an example touch controller 106 (e.g., a multi-touch controller) according to an embodiment of the present disclosure. Receive (RX) section 107 of touch controller 106 can include miscellaneous channels 305 (e.g., channels for infrared sensors, temperature sensors, etc.) and a total of N receive channels, such as sense channels 307. Sense channels 307 can be connected to an offset compensator 309. Multistage vector demodulation engine 109 can include a digital demodulation section 313, a result memory 315, and a vector operator 317. Digital demodulation section 313 can be connected to a receive NCO 319, and vector operator 317 can be connected to a decode matrix RAM 321 and connected to a result RAM 323. Transmit (TX) section 114 can include a transmit logic 327, a transmit DAC 329, and a total of M transmit channels 333. Transmit NCO 335 can provide a clock to transmit logic and TX DAC and charge pump 115 can provide power to the transmit channels. Transmit channels 333 can be connected to a stimulation matrix RAM 337 via an analog bus 339. Decode matrix RAM 321, result RAM 323, and stimulation matrix RAM 337 could be, for example, part of RAM 112. Processor subsystem 102 can store and update, for example, a decode matrix in decode matrix RAM 321 and a stimulation matrix in stimulation matrix RAM 337, initialize the multi-touch subsystem, for example, process data from the receive channels and facilitate communications with the host processor.

FIG. 3 shows processor subsystem 102, panel scan logic 110, and host processor 128. FIG. 3 also shows a clock generator 343 and a processor interface 347. Various components of touch controller 106 can be connected together via a peripheral bus 349. Processor interface 347 can be connected to host processor 128 via a processor interface (PI) connection 353.

Figure 4:
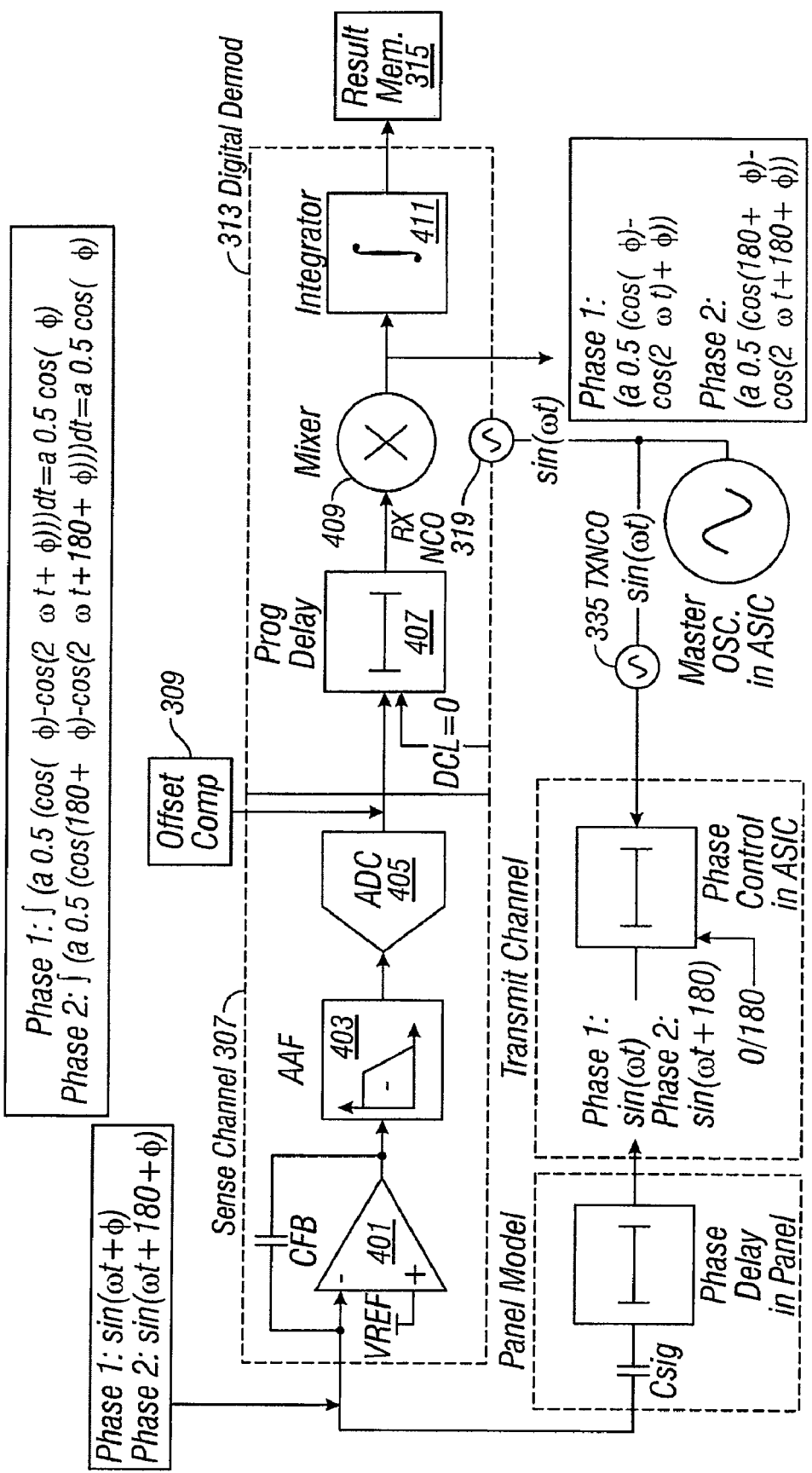
FIG. 4 illustrates details of one of the sense channels and digital demodulation section according to various embodiments.

FIG. 4 illustrates details of one of the sense channels 307 and digital demodulation section 313 according to an embodiment of the present disclosure. As shown in FIG. 4, sense channel 307 can include a transimpedance amplifier (TIA) 401, an anti-alias filter (AAF) 403, and an analog-to-digital converter (ADC) 405. Digital demod section 313 can include a programmable delay 407, a mixer (signal multiplier) 409, and an integrator 411. In each step of the scan, TIA 401 of sense channel 307 can receive a composite signal charge along with a programmable offset charge.

In some cases, the sense signal can be adjusted by offset compensator 309 prior to being input to TIA 401. Adjusting the offset of the digital signal can reduce the dynamic range of some stimulation signals generated from highly variable stimulation matrices. In particular, some highly variable stimulation matrices may result in sense signals having a dynamic range greater than the dynamic input range of TIA 401; that is, the maximum signal magnitude that the amplifier can accept before the charge amplifier saturates. For example, in the case that the stimulation matrix is a Hadamard matrix, in one of the steps in the scan all of the channels are driven with stimulation signals having the same phase, and it is possible that all of the resulting component sense signals would add up to generate a composite sense signal with an amplitude that saturates TIA 401. In this case, offset compensation would be used to subtract sufficient charge from the input charge as to prevent the charge amplifier from saturating. Offset compensation during a scan can be performed on-the-fly, that is, different offset compensation can be applied during different steps of the scan.

In another example embodiment, saturation of TIA 401 may be mitigated by adjusting, for example, the feedback of the amplifier. As is described herein, feedback of TIA 401 can be resistive, in addition to capacitive feedback, described in previous U.S. patent application Ser. No. 12/283,423, for example. In this case, individual sense channels can be adjusted, but the adjustment can remain the same for each step in a scan. This approach can be acceptable in the case that the stimulation matrix being used causes the same or similar imbalances of signals in the channels throughout the scan, and the amount of adjustment is not too great, e.g., up to a factor of 2. For example, using a circulant matrix as the stimulation matrix can cause a fixed imbalance across all steps.

The processing of a sense signal to obtain a value for Qsig_total is described below in reference to processing a single component of the sense signal of one sense channel (resulting from the stimulation of one of the channel's pixels) to obtain a single Qsig component of Qsig_total for that sense channel. However, it is understood that the analysis applies to all component signals, and that an actual Qsig_total result may be understood as simply a superposition of the individual Qsig results of the other component signals.

When a stimulation signal, Vstim, is applied to the drive line of a pixel, the AC portion of the stimulation signal, Vstim_AC(t), can be coupled through to the sense line, generating a signal charge Qsig(t) that tracks Vstim_AC(t) with an amplitude proportional to the signal capacitance Csig of the pixel. Qsig(t) can be expressed as:

$$Qsig(t) = Csig \times Vstim\_AC(t) \tag{1}$$

A feedback capacitance, for example, in the feedback path of TIA 401 can convert the injected signal charge into an output voltage relative to the reference voltage of VREF of the charge amplifier $$V_{amp\_out}(t) = \frac{Qsig(t)}{C_f} \tag{2}$$

Substituting for Qsig(t) using equation (1) yields:

$$V_{amp\_out}(t) = \frac{Csig}{C_f} \times Vstim\_AC(t) \tag{3}$$

Thus, TIA 401 can output a signal whose amplitude is the stimulus amplitude Vamp_out(t) scaled by the gain (Csig/Cf) of the charge amplifier. In more general terms, sensor panel 124 can add an amplitude modulation to the drive signal, the amplitude modulation carrying information about something to be sensed, e.g. the a finger, etc.

The output of TIA 401 can be fed into AAF 403. AAF 403 can attenuate noise components above the nyquist sampling limit of the ADC sufficiently to prevent those components from aliasing back into the operating frequency range of touch controller 106. Furthermore, AAF 403 can attenuate any noise outside the frequency operating range of touch controller 106 and therefore helps to improve the Signal-to-Noise ratio. It also can be important to properly select the sampling clock FCLK_DAC of the TX DAC. Generating a signal of frequency FSTM at the TX DAC clock rate can introduce images in the spectrum of the TX DAC output signal at n*FCLK_DAC+/-FSTM whereas N=1,2 . . . , to infinity. The images will appear in the composite signal entering the receive channel. Upon sampling the composite signal with the ADC in the receive channel, those images can be folded around the sampling frequency FCLK_ADC at which the ADC samples the composite touch signal. The output of the ADC therefore can have the following frequency components: N*(FCLK_DAC+/-FCLK_ADC)+/-FSTM. If the DAC and ADC clock rate FCLK_DAC and FCLK_ADC, respectively, are the same frequency, these images can appear in the pass-band. In the above example, one possible frequency component can be (FCLK_DAC-FCLK_ADC)+FSTM=FSTM and therefore can appear as an undesirable in-band component which can lead to reduced SNR and therefore reduced touch performance. Therefore, it can be beneficial to select a TX DAC sampling frequency FCLK_DAC that is different from the ADC sampling rate. This can prevent the images from folding back into the pass-band. In one embodiment, FCLK_DAC can be twice of the ADC clock rate FCLK_ADC. The two clock sources should be correlated, i.e. based on the same master clock. It can be beneficial to make the DAC sampling clock higher in frequency than the ADC sampling clock as DACs can consume less power than the power consumed by all ADCs combined for the same increase in sampling clock frequency.

The output of AAF 403 can be converted by ADC 405 into a digital signal, which can be sent from sense channel 307 to digital demodulation section 313. Digital demodulation section 313 can demodulate the digital signal received from sense channel 307 using a homodyne mixing process in which the signal is multiplied with a demodulation signal of the same frequency. In order to increase the efficiency of the mixing process, it may be desirable to adjust the phase of the sense channel output signal to match the phase of the demodulation signal. Stimulating a pixel of sensor panel 124 with Vstim+ and processing the resulting sense signal as described above can result in the following output from sense channel 307:

$$V_{sense\_ch\_outV+}(t) = \frac{Csig}{C_f} \times V_0 \sin(\omega t + \theta) \quad (4)$$

where: $V_0$=the amplitude of the AC portion of Vstim=2.25V $\theta$=the relative phase delay between the signal output of ADC 405 and the demodulation signal for a given sense channel For stimulation with Vstim−, the resulting output from ADC 405 can be:

$$V_{sense\_ch\_outV-}(t) = \frac{Csig}{C_f} \times V_0 \sin(\omega t + 180° + \theta) \quad (5)$$

The relative phase delay $\theta$ can be an aggregate of delays caused by various elements of the system, such as the geometry of the signal paths, the operation of the output buffers, etc. In general, the various delays in the system can be separated into two categories, delays that apply equally to all drive lines of a sense channel, referred to as global delays herein, and delays that vary among the drive lines of the sense channel, referred to as individual line delays herein. In other words, global delays can affect all component signals of the composite sense signal equally, while individual line delays can result in different amounts of delay for different component signals. The relative phase delay can be represented as:

$$\theta = DCL + \phi(R) \quad (6)$$

where: DCL=the sum of all global delays (referred to herein as the composite global delay) affecting a sense channel $\phi(R)$=the individual line delay associated with drive line R of a sense channel Substituting equation (6) into equations (4) and (5) yields:

$$V_{sense\_ch\_outV+}(t) = \frac{Csig}{C_f} \times V_0 \sin(\omega t + DCL + \phi(R)) \quad (7)$$

$$V_{sense\_ch\_outV-}(t) = \frac{Csig}{C_f} \times V_0 \sin(\omega t + 180° + DCL + \phi(R)) \quad (8)$$

Since the global delays can affect all of the component signals of the sense signal equally, once the composite global delay DCL has been determined for a channel, the global portion of the phase delay of sense channel output signal can be removed by programmable delay 407, yielding:

$$V_{mixer\_inV+}(t) = \frac{Csig}{C_f} \times V_0 \sin(\omega t + \phi(R)) \quad (9)$$

$$V_{mixer\_inV-}(t) = \frac{Csig}{C_f} \times V_0 \sin(\omega t + 180° + \phi(R))$$

as the signals corresponding to Vstim+ and Vstim−, respectively, that are input into mixer 409.

Since the individual line delays can be different for different signal components of the sense signal, the individual line delays cannot be removed from the sense signal simply by using a single phase adjustment to the composite sense signal, such as the phase adjustment made by programmable delay 407. However, the individual line delays may be accounted for by the compensated phase matrix $\tilde{M}_{comp}^{-1}$, which is described in more detail below.

The phase-adjusted signal can be sent from programmable delay 407 to mixer 409. Mixer 409 can multiply the phase-adjusted signal with a demodulation signal, $$V_{demod} = \sin(\omega t), \quad (11)$$

which can be generated by RX NCO 319 based on a master oscillator 415. It is noted that the mixing can be performed using digital signals. This can provide higher resolution than in some previous designs, which can result in improved suppression of noise.

The resulting demodulated signal output from mixer 409 can be expressed as:

$$V_{mixer\_outV+}(t) = \frac{1}{2} \times \frac{Csig}{C_f} \times V_0 \times (\cos(\phi(R)) - \cos(2\omega t + \phi(R))) \quad (12)$$

$$V_{mixer\_outV-}(t) = \quad (13)$$
$$\frac{1}{2} \times \frac{Csig}{C_f} \times V_0 \times (\cos(180° + \phi(R)) - \cos(2\omega t + 180° + \phi(R)))$$

The mixer output can be integrated by integrator 411, yielding:

$$V_{int\_outV+} = \frac{1}{2} \times \frac{Csig}{C_f} \times V_0 \times \cos(\phi(R)) \quad (14)$$

$$V_{int\_outV-} = \frac{1}{2} \times \frac{Csig}{C_f} \times V_0 \times \cos(180° + \phi(R)) \quad (15)$$

Since the integrator has essentially a low pass response, the high frequency component $\cos(2\omega t + 180° + \phi(R))$ can be eliminated leaving only the DC component.

Scaling of the results in integrator 411 by a factor of $2C_f$ results in output signals:

$$V_{int\_scaledV+} = V_0 \times \cos(\phi(R)) \times Csig, \text{ if } Vstim(R) = Vstim+ \quad (16)$$

$$V_{int\_scaledV-} = V_0 \times \cos(180° + \phi(R)) \times Csig, \text{ if } Vstim(R) = Vstim- \quad (17)$$

from integrator 411. In each step S in a scan of sensor panel 124, drive lines 204 are driven with either Vstim+ or Vstim– drive signals based on the MUX_SEL values in stim matrix 407 for that step, each stimulation signal generating a component output (16) or (17) of integrator 411 for each sense channel. Thus, for a channel C, the output of integrator 411 can be a linear combination of corresponding components (16) and (17):

$$V_{int\_scaled\_tot\_C}(S) = V_0 \times W_C(0, S) \times Csig(0) + \quad (18)$$
$$V_0 \times W_C(1, S) \times Csig(1) + \ldots V_0 \times (M-1, S) \times Csig(M-1)$$

where: $W_C(R, S) = \begin{cases} \cos(\phi_C(R)) \xrightarrow{if} Vstim(R, S) = Vstim+ \\ \cos(180° + \phi_C(R)) \xrightarrow{if} Vstim(R, S) = Vstim- \end{cases}$ The right hand side of equation (18) includes $V_0$ equal to the amplitude, Vstim, of the stimulation signals and $W_C(R,S)$ equal to the components of the compensated phase matrix $\tilde{M}_{C\_comp}$. Therefore, the output voltage of integrator 411, $V_{int\_scaled\_tot\_C}(S)$, at each step is simply the composite signal charge Qsig_tot$_C$(S).

The Qsig_tot$_C$ values output by a channel's integrator 411 can be posted to result memory 315, forming a Qsig_tot$_C$ vector:

$$\text{Qsig\_tot}_C(S) = \begin{bmatrix} \text{Qsig\_tot}_C(0) \\ \text{Qsig\_tot}_C(1) \\ \text{Qsig\_tot}_C(2) \\ \vdots \\ \text{Qsig\_tot}_C(P-1) \end{bmatrix} \quad (19)$$

that is used in a decoding operation to determine the Csig values for that channel. An example vector decode operation according to various embodiments will now be described. Referring to FIG. 3, vector operator 317 can read the Qsig_tot$_C$ vector from memory 315 and reads the decode matrix $$\frac{\tilde{M}_{C\_comp}^{-1}}{Vstim}$$

from decode matrix RAM 321. Vector operator 317 then performs vector multiplication of the Qsig_tot$_C$ vector and the decode matrix $$\frac{\tilde{M}_{C\_comp}^{-1}}{Vstim}$$

according to equation (9) to obtain the Csig$_C$ vector for channel C:

$$\tilde{Csig}_C = \begin{bmatrix} Csig_C(0) \\ Csig_C(1) \\ Csig_C(2) \\ \vdots \\ Csig_C(M-1) \end{bmatrix} \quad (20)$$

The Csig$_C$ vector can be posted to result RAM 323, where it can be read by other systems, such as processor subsystem 102, host processor 128, etc., for sensing touch by comparing the Csig$_C$ vector components with known, static (no touch) values for Csig, for example.

Figure 5:
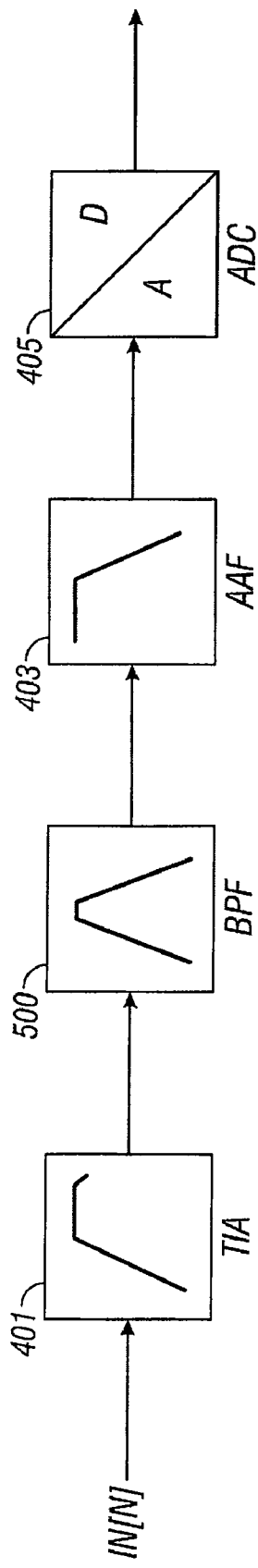
FIG. 5 illustrates an exemplary single-ended analog front end, with a transimpedance amplifier (TIA), a bandpass filter (BPF), a anti-aliasing filter (AAF) and an analog-to-digital converter (ADC), according to various embodiments.

However, as an alternative to capacitive feedback in TIA 401, resistive feedback in TIA 401 can be implemented. FIG. 5 illustrates an exemplary single-ended analog front end (AFE), with an ADC 405 and bandpass filter (BPF) 500. Of course, various ADCs may be employed (e.g., a 9-bit successive-approximation-register (SAR)) without departing from the scope of the present disclosure. Stage 1 of the AFE includes TIA 401, which is described in greater detail below with respect to FIG. 7.

The output of TIA 401, according to certain embodiments, can be input to BPF 500, at Stage 2 of the AFE. The exemplary BPF 500 can provide 10 dB/octave of attenuation toward lower frequencies (i.e., below FSTM). As shown in FIG. 5, the output of the BPF 500 can be input to AAF 403, at Stage 3 of the AFE, the output of which can be input to ADC 405.

Figure 6:
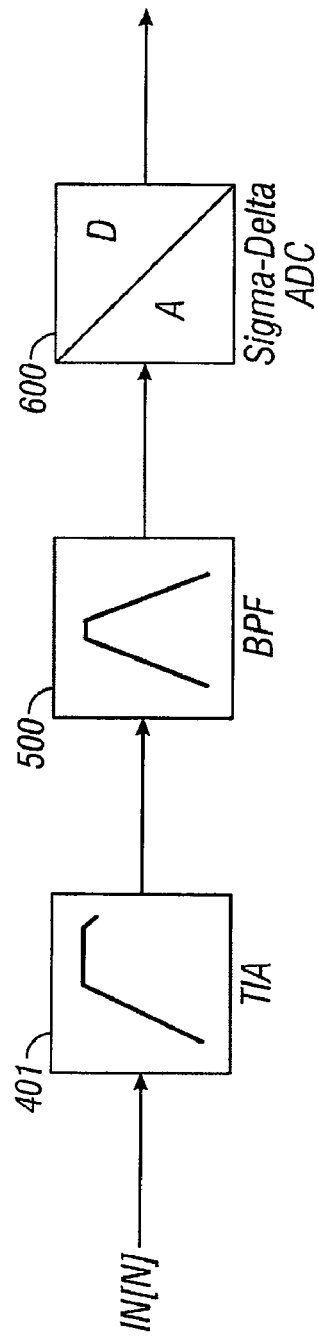
FIG. 6 illustrates an exemplary single-ended analog front end with a transimpedance amplifier (TIA), a bandpass filter (BPF) and a Sigma-Delta ADC, according to various embodiments.

According to one embodiment, AAF 403 and ADC 405 can be replaced with a Sigma-Delta ADC 600, for example, as shown in FIG. 6. Sigma-Delta ADC 600 can have low-pass filter response, which substantially provides the functionality of AAF 403. AAF 403 is described below in greater detail with reference to FIG. 9.

Figure 7:
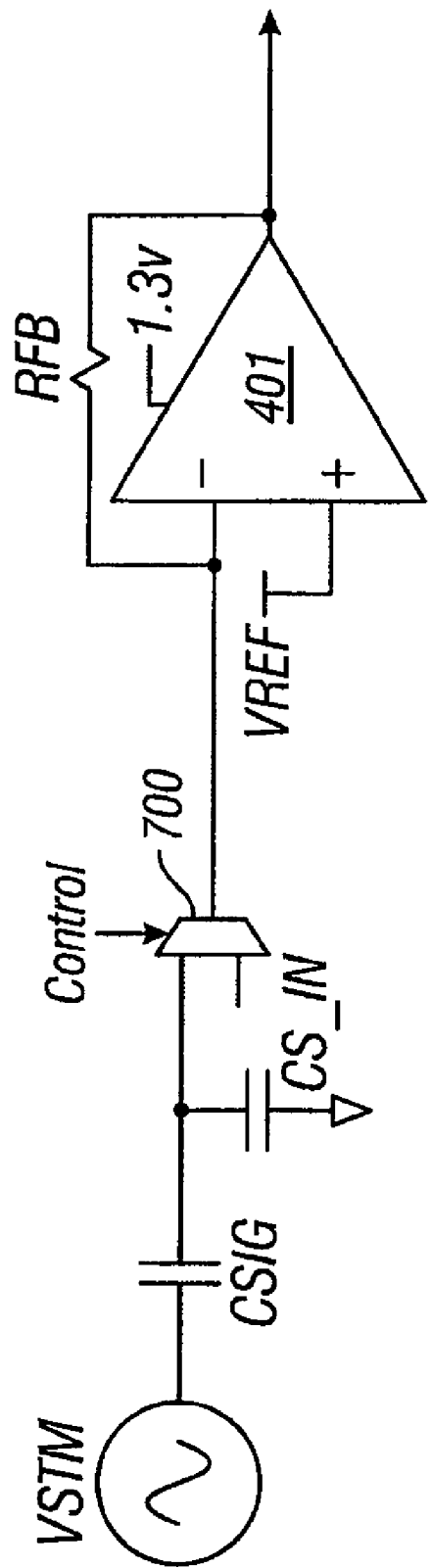
FIG. 7 illustrates an exemplary transimpedance amplifier (TIA), according to various embodiments.

FIG. 7 illustrates TIA 401, of the AFE, with a feedback resistor RFB, according to an embodiment. As shown in FIG. 7, feedback resistor RFB can be coupled to the negative input of TIA 401 and to the output of TIA 401. As resistors have a relatively small footprint, feedback resistor RFB can consume significantly less DIE real estate as compared to a capacitor, for example.

The single pole open loop transfer function of the amplifier can be:

$$V_{OUT} = \frac{G_0}{1 + \frac{s}{\omega_0}} \cdot (V_+ + V_-) \quad (21)$$

$V_{OUT}$=output voltage of the amplifier, $\omega_0$ is the amplifier's pole frequency, $G_0$ is the DC gain bandwidth of the amplifier, $V_+$ the voltage at the non-inverting input of the amplifier (=0V) and $V_-$=the voltage at the inverting input;
The voltage into the inverting node of the preamplifier and hence across the stray capacitor is:

$$V_- = \frac{s \cdot C_{SIG} \cdot (V_{STM} - V_-) + \frac{(V_{OUT} - V_-)}{R_{FB}}}{s \cdot C_S} \quad (22)$$

After combining equations (21) ad (22) and further simplification this leads to:

$$V_{OUT} = -\frac{s \cdot R_{FB} \cdot C_{SIG}}{1 + \frac{s \cdot R_{FB} \cdot \left(1 + \frac{s}{\omega_0}\right)(C_{SIG} + C_S)}{G_0}} \cdot V_{STM} \quad (23)$$

Therefore, the TIA has bandpass filter response. The gain bandwidth of the amplifier is chosen such that at the stimulus frequency range of interest the denominator of equation (23) is approximately 1 and equation (23) reduces to:

$$H_{TIA}(s) = s \cdot R_{FB} \cdot C_{SIG} \quad (24)$$

Equation (24) leads to:

$$H_{TIA}(\omega_{STM}) = \omega_{STM} \cdot R_{FB} \cdot C_{SIG} \quad (25)$$

Therefore for the stimulus frequency range of interest, TIA has high-pass filter response and the signal at the output of the preamplifier is phase-shifted by 90 degrees relative to VSTM. Note that the stray capacitance CS drops out of the equation as desired for the stimulus frequency range of interest.

RFB can be adjustable as to maximize the dynamic output range of VOUT of the TIA for a given stimulus frequency FSTM. It may be desirable to move the stimulus frequency as far above an interferer as possible. For example, a switching power supply can introduce noise into the touch subsystem at 100 Khz. In this scenario it can be beneficial to move FSTM to a higher frequency. A stimulus frequency of 200, 400 and 800 Khz can cause attenuation of the 100 Khz noise component in the TIA by 6, 12 and 18 dB, respectively.

The lowpass filter response above of the TIA 401 can add benefits as it can attenuate high frequency noise that can be induced into the touch mechanism and also can help to meet the nyquist attenuation requirements According to an embodiment, at least one optional multiplexor 700 can be added at the input of TIA 401, thereby allowing two or more inputs to be multiplexed into one dedicated channel, for example (e.g., 0.5 channels per input), thereby further reducing the required real estate of the DIE.

Figure 8:
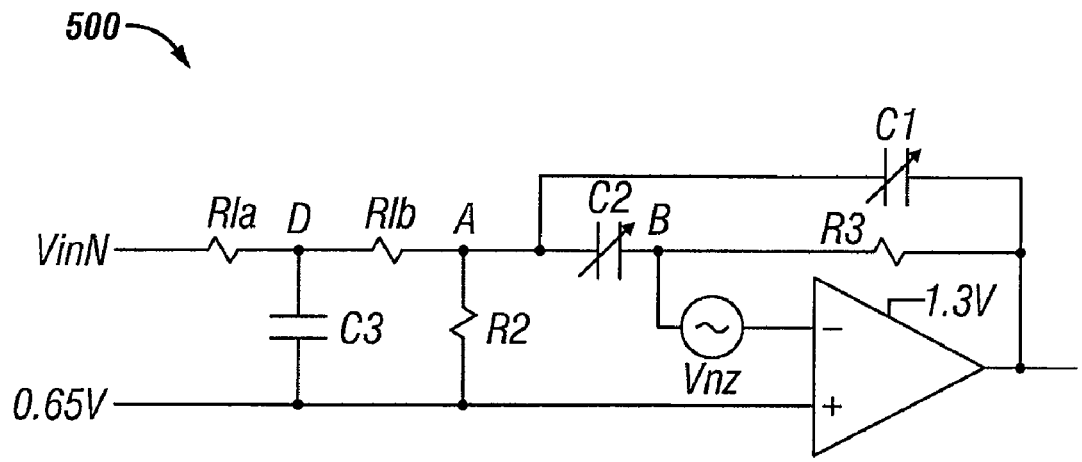
FIG. 8 illustrates an exemplary bandpass filter in an analog front end, according to various embodiments.

FIG. 8 is an illustration of an exemplary BPF 500, according to an embodiment. As described above, BPF 500 can provide 10 dB/octave of attenuation at frequencies outside the passband. The gain of the band-pass filter allows adjustment of the available TIA output voltage range for noise. According to certain embodiments, the dynamic range at the output of the TIA or input of the bandpass filter can be: VSIG_DYN=VOUT_TOT/G_BPF,
Where:
  VSIG_DYN is the dynamic range of the touch signal;
  VTOT_DYN=total dynamic output range available for in-band signal component and noise (e.g. 0.9V); and
  G_BPF=bandpass gain (e.g., 6).

In the above example, the dynamic range for the in-band signal component would be 0.9V/6=0.15V.

Therefore the remainder of the output range VTOT_DYN−VSIG_DYN=0.9V−0.15V=0.75V would be available for out of band noise components. The max output of TIA 401 can be 0.15V, therefore resulting in a 0.9 peak-to-peak voltage, for example, with a passband gain of 6 at BPF 500. Thus, the headroom (0.9 V−0.15 V) can be left for external noise sources. Using this input voltage can remove a significant amount of interferers (above 0.15 V), while leaving the signal (i.e., the in-band component at or below 0.15 V). Input resistance R1$a$ and/or R1$b$ can be expressed as:

$$R1 = Q/(G * 2 * \pi * f * C) \quad (26)$$

G (passband gain) and f (center frequency) are defined below, and Q is expressed as:

$$Q = 0.5 * (R3 * (R1 + (R2/2))/(R1 * (R2/2)))^{0.5} \quad (27)$$

Q determines the bandwidth of the filter, such that the bandwidth equals f/Q (e.g., Q may be set to 2.5 according to an embodiment).

Attenuator Resistance R2 can be Expressed as:

$$R2 = 2 * Q/((2 * Q2 - G) * 2 * \pi * f * C) \quad (28)$$

(the 2 is for full differential inputs, but the 2 can be omitted for single ended inputs).

Feedback Resistance R3 can be Expressed as:

$$R3 = Q/(\pi * f * C) \quad (29)$$

Passband Gain G can be Expressed as:

$$G = 1/((R1/R3) * 2) = R3/(2 * R1) \quad (30)$$

Center Frequency f can be programmable using a 5-bit adjustment, for example, and can be expressed as:

$$f = (1/(2 * \pi * C)) * \sqrt{((R1 + (R2/2))/(R1 * (R2/2) * R3))} \quad (31)$$

It is noted that this type of adjustment can yield a constant Q independent of the value of C.

Figure 9:
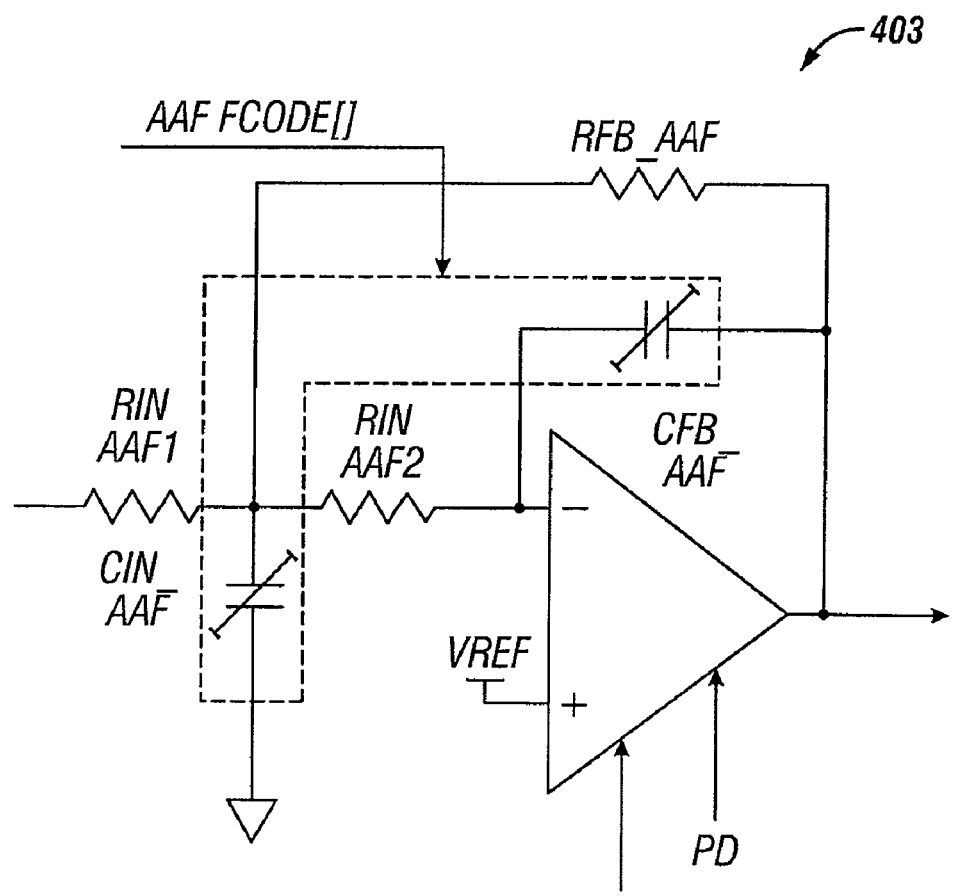
FIG. 9 illustrates an exemplary anti-aliasing filter in an analog front end, according to various embodiments.

FIG. 9 illustrates an exemplary AAF 403 in an AFE, according to an embodiment. As described above with respect to FIG. 4, the output of TIA 401 can be fed into AAF 403. AAF 403 can attenuate noise components above the nyquist sampling limit of ADC 405 sufficiently to prevent those components from aliasing back into the operating frequency range of touch controller 106. Furthermore, AAF 403 can attenuate any noise outside the frequency operating range of touch controller 106 and therefore helps to improve the signal-to-noise ratio. The output of AAF 403 can be converted by ADC 405 into a digital signal, which can be sent from sense channel 307 to digital demodulation section 313. Digital demodulation section 313 demodulates the digital signal received from sense channel 307 using a homodyne mixing process in which the signal is multiplied with a demodulation signal of the same frequency. Of course, in an alternate embodiment depicted in FIG. 6, AAF 403 can be left out when using a sigma-delta ADC 600, for example. The sigma-delta ADC 600 can consume more power than ADC 405, but can provide enhanced noise attenuation.

Figure 10:
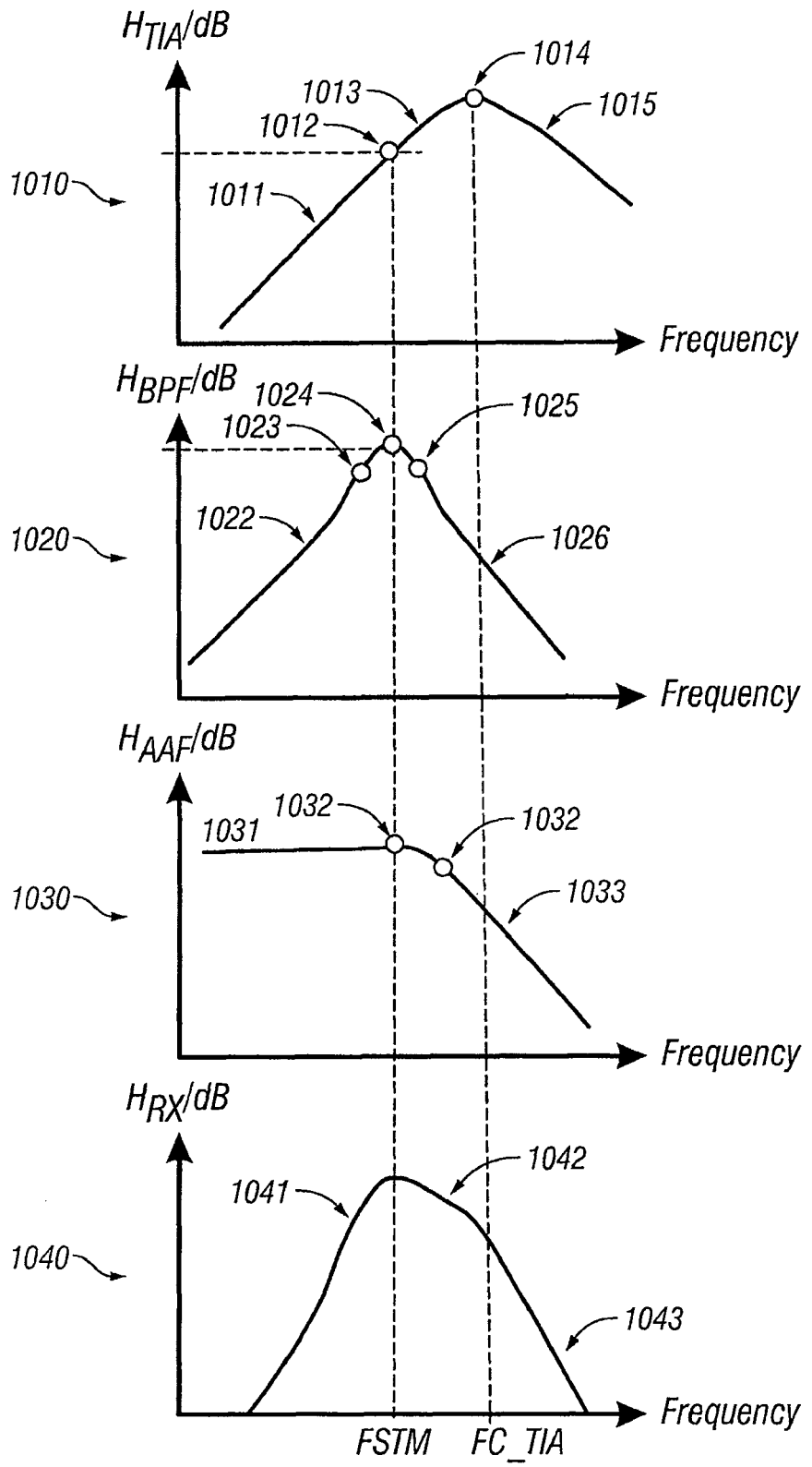
FIG. 10 illustrates exemplary frequency response plots, according to various embodiments.

FIG. 10 illustrates various frequency response plots, according to embodiments. Referring to FIG. 10, the combined frequency response HRX of the receive (RX) channel can be expressed as:

$$H_{RX}(\omega) = H_{TIA}(\omega) \cdot H_{BPF}(\omega) \cdot H_{AAF}(\omega) \cdot H_{ADC}(\omega) \quad (32)$$

Here $H_{TIA}(\omega)$, $H_{BPF}(\omega)$, $H_{AAF}(\omega)$ and $H_{ADC}(\omega)$ are the frequency transfer functions of the TIA, BPF, AAF and ADC, respectively. Plot 1010 shows an exemplary frequency response of TIA 401. The lowpass filter response below the peak 1014 of the TIA 401 can be approximately 6 dB per octave or 20 dB per decade. RFB can be adjusted such that the in-band signal component H_TIA at the stimulus frequency FSTM as indicated by point 1012 is at least a factor of G_BPF=6 or 15.56 dB below the full-scale voltage VTOT_DYN at the output of TIA 401.

For the given topology, the peak of the transfer function plot 1010 as indicated by point 1014 can be set by the feedback network of the TIA 401 and can be typically well above point 1012. Therefore, the TIA 401 can operate as a true differentiator at frequencies below FSTM, which may be desirable. Generally, it may be desirable to move point 1014 as close to point 1012 as possible in order to prevent noise frequencies above point 1012 to be amplified due to the high-pass filter response of the TIA 401

Plot 1020 shows an exemplary frequency response of the BPF 500. Point 1024 is indicative of the center frequency FC of the BPF 500 and can be tuned to a given stimulus frequency as to maximize the in-band signal component while suppressing noise components outside a given pass-band. Points 1023 and 1025 can be the −3 dB points and the difference in frequency between points 1023 and 1024 can represent the bandwidth of the BPF which is equivalent to the center frequency of the BPF 500 divided by its quality factor Q_BPF.

Plot 1030 shows an exemplary frequency response of the AAF 403. The AAF 403 may be an active or passive filter dependent on the anti-aliasing requirements. If a $2^{nd}$ or higher order frequency response is desired it becomes necessary to use an active filter topology, which may yield a frequency response similar to that shown in plot 1030.

Point 1032 indicates the center or resonant frequency of the AAF 403 and 1032 the −3 dB point. The range below point 1032 is the passband with the gain being ideally 1 (or 0 dB). For a AAF 403 of $2^{nd}$ order the roll-off 1033 may be up to close to 40 dB/decade.

Plot 1040 shows an exemplary frequency response of the entire receive (RX) channel. If, for example, the low-pass filter roll-off of the TIA 401 is 20 dB/decade and the BPF 500 lowpass filter roll-off is 30 dB per decade and the AAF 403 can have a gain of 0 dB/decade, the combined roll-off of the entire RX channel can be 50 dB per decade, as indicated by Eq. (34).

The frequency response H_RX between points 1012 and 1014 can be that of a low-pass filter. However, the highpass filter response 1012 of the TIA 401 up to that point counter can act the low-pass filter response of the BPF 500. Therefore, the combined roll-off of the TIA 401 and BPF 500 can be 30 dB/decade−20 dB/decade=10 dB/decade.

The AAF 403 compensates for the high-pass filter response of the TIA 401 and can be necessary to meet the anti-aliasing requirements of the ADC 405, for example. If, for example, the AAF 403 has a lowpass filter roll-off of 35 dB, the total low-pass filter roll-off in segment 1042 can be 10 dB/decade+35 dB/decade=45 dB/decade.

In segment 1043, the frequency response of the TIA 401 can be past point 1014 and therefore the combined low-pass filter roll-off can be the sum of the roll-offs of segments 1015, 1026 and 1033 for a total of 20 dB/decade+30 dB/decade+35 dB/decade=85 dB/decade The AAF 403 can be provided to meet the overall attenuation requirements in the aliased frequency range FSAMP-FSTM(MAX) to FSAMP-FSTM(MIN). Also, the AAF 403 can compensate for the high-pass filter response of the TIA 401 above the selected RX center frequency. It can be beneficial to make the AAF 403 cutoff frequency programmable so it can track the BPF 500 center frequency in order to optimize the lowpass filter roll-off and compensate for the high pass filter response of the Dependent on the type of ADC architecture selected, the AAF 403 may not be needed. The AAF 403 can be a second order active filter with programmable cut-off frequency. The transfer function of the AAF 403 filter can be provided as:

$$H(s) = \frac{GAIN\_AAF \cdot \omega_0^2}{s^2 + \frac{\omega_0}{Q\_AAF} \cdot s + \omega_0^2} \quad (33)$$

Where: GAIN_AAF=gain of AAF $$GAIN\_AAF = -\frac{R_{FB\_AAF}}{R_{IN\_AAF}} \quad (34)$$

Q_AAF=quality factor of AAF:

$$Q\_AAF = \frac{1}{\omega_0 \cdot C_{FBK\_AAF} \cdot \sqrt{R_{IN\_AAF} + 2 \cdot R_{IN\_AAF2}}} \quad (35)$$

$\omega_0$ = "resonant" frequency of $AAF$ (in radians):

$$\omega_0 = \frac{1}{\sqrt{C_{IN\_AAF} \cdot C_{FBK\_AAF} \cdot R_{IN\_AAF1} \cdot R_{IN\_AAF2}}} \quad (36)$$

Due to the peaking of the AAF 403, the actual cut-off frequency FC_AAF can be calculated according to the following formula:

$$FC\_AAF = \frac{FSF \cdot \omega_0}{2 \cdot \pi} \quad (37)$$

Where: FSF=Frequency scaling factor.

The cutoff frequency can be adjusted by making $C_{IN\_AAF}$ and $C_{FBK\_AAF}$ programmable.

Figure 11:
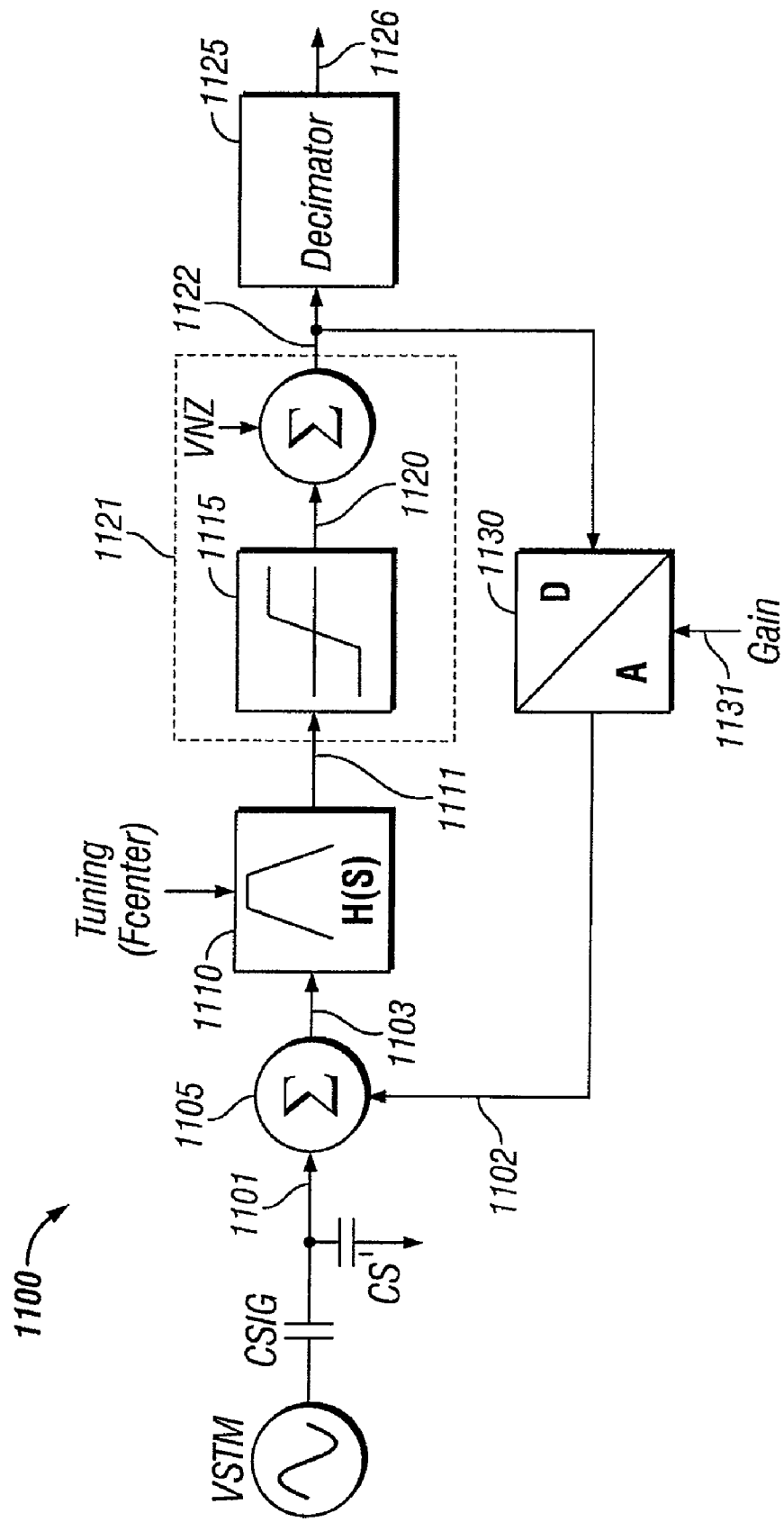
FIG. 11 illustrates an exemplary analog front end combining transimpedance amplifier (TIA), bandpass and analog to digital converter (ADC) functions into a single block, according to various embodiments.

FIG. 11 illustrates an exemplary analog front end, according to various embodiments. This implementation combines a TIA, bandpass and ADC functions into one single block. The resulting device 1100 can be essentially a sigma delta convertor with bandpass filter response. Summer 1105 sums the sense signal 1101 with the feedback signal 1102 from ADC 1130. The summing node 1105 can be held at virtual ground in order to reject the stray capacitance CS of the sense line. Summing node 1105 can be the non-inverting input node of a TIA, and may nor may not be part of the bandpass filter 1110. The resulting signal 1103 can be fed into a bandpass filter which can have a programmable center frequency. The bandpass filtered signal 1111 can be fed into a quantizer 1115, which can have one or multiple quantization levels. The digitized signal 1122 can then be converted to an analog signal 1102 and fed back to summing node 1105. The quantization noise VNZ introduced by quantizer 1115 can be modeled by summer 1120. Gain adjustment can be accomplished via digital gain adjustment 1131 which scales the feedback signal 1102 therefore allowing gain adjustment. The digitized signal can also be fed into Decimator 1125 and the decimated signal 1126 can be then passed on for further processing. Note that the sigma delta modulator described can be a higher order sigma delta modulator and can have tunable resonators as bandpass filters. Similar sigma delta modulators are described in U.S. Pat. No. 6,218,972 entitled "Tunable bandpass sigma-delta digital receiver" and U.S. Pat. No. 5,027,120 entitled "Delta-sigma convertor with bandpass filter for noise reduction in receivers".

As a potential advantage, according to the embodiment depicted in FIG. 11, noise may be rejected at the input (Stage 1) of AFE while the ADC's 600 dynamic output range is maximized, and signal-to-noise ratio can be boosted. This provides a single-stage approach, with no requirement for a separate AAF 403. However, power consumption may be higher, as compared to using a biquad filter, as described below with reference to FIG. 12.

Figure 12:
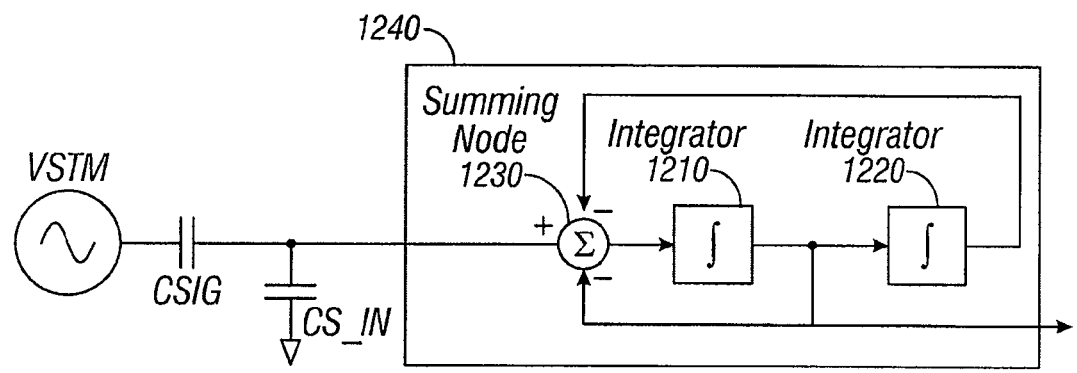
FIG. 12 illustrates a high level concept of a biquad filter, according to various embodiments.

As yet another alternative, BPF 500 may be implemented in Stage 1 with the AFE including a biquad bandpass filter implementing nested feedback as shown in FIG. 12. In this case, the biquad bandpass filter includes a virtual ground capability. As shown in FIG. 12, the biquad filter can be based on a two state variable filter 1240, which can be comprised of two integrators 1210 and 1220 and a summing node.

Figure 13:
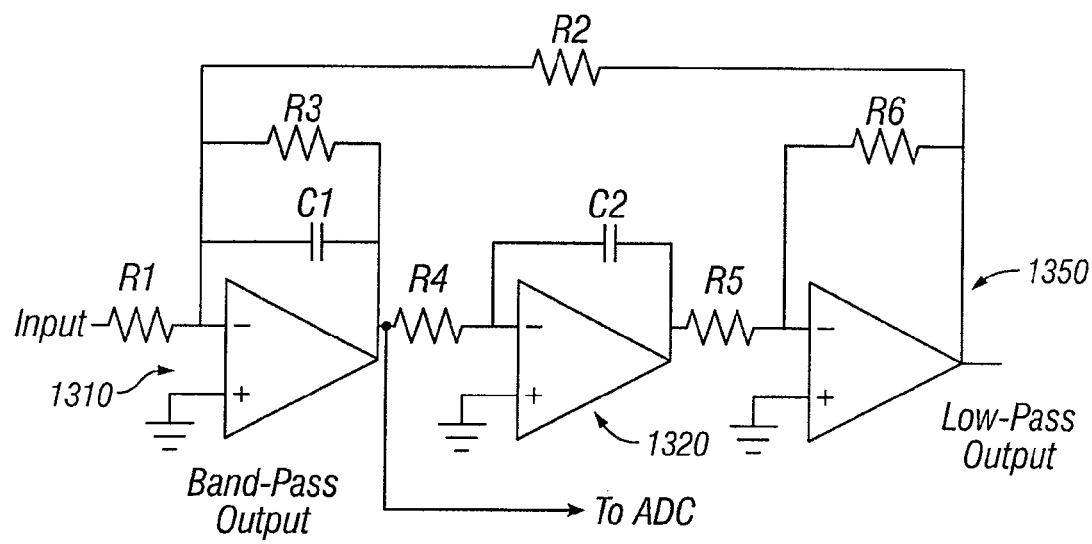
FIG. 13 illustrates an exemplary Tow Thomas biquad filter, according to various embodiments.

FIG. 13 shows a circuit example of a Tow Thomas biquad filter, which may also be implemented at Stage 1. Here CSIG replaces the input resistor R1 commonly used in the Tow Thomas biquad filter topology. Invertor 1350 can be utilized to establish proper polarity and is not needed in fully differential implementations. The inverting input of the first integrator 1310 can serve as the summing node. The output of first integrator 1310 can be fed into second integrator 1320. Since the summing node can be held at virtual ground, it can reject CS, the stray capacitance imposed on the input of the biquad filter by the sensor panel. With the bandpass filtering at the input (Stage 1) of the AFE, noise can be rejected at Stage 1, while maximizing the dynamic output range and boosting the signal-to-noise ratio. However, a biquad filter may consume more DIE real estate, as compared to the resistive feedback TIA 401 using only feedback resistor RFB, as shown in FIG. 7. Various combinations of capacitances, resistances and Q may be programmable.

Thereafter, Stage 2 can include sigma-delta ADC 600, for example. Thus, no separate anti-aliasing filter would be required, due to the combined lowpass filter response of the biquad filter and the sigma delta convertor, and the relative high oversampling rate of the sigma delta convertor.

Figure 14A:
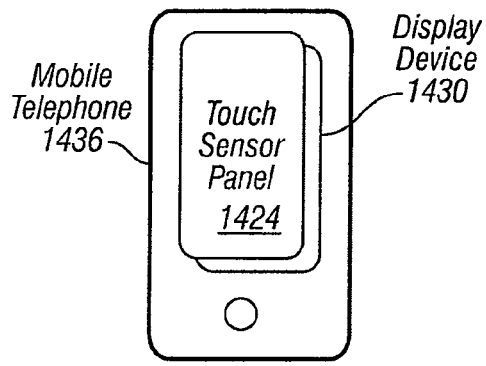
FIG. 14a illustrates an exemplary mobile telephone that can include a touch sensor panel according to the various embodiments described herein.

FIG. 14a illustrates an example mobile telephone 1436 that can include touch sensor panel 1424 and display device 1430, the touch sensor panel including an analog front end design according to one of the various embodiments described herein.

Figure 14B:
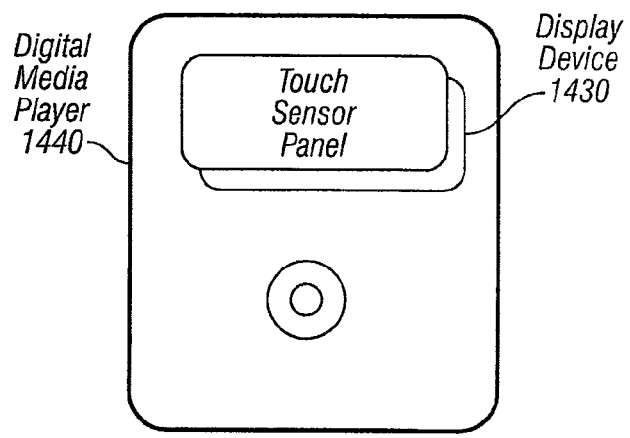
FIG. 14b illustrates an exemplary digital media player that can include a touch sensor panel according to the various embodiments described herein.

FIG. 14b illustrates an example digital media player 1440 that can include touch sensor panel 1424 and display device 1430, the touch sensor panel including an analog front end design according to one of the various embodiments described herein.

Figure 14C:
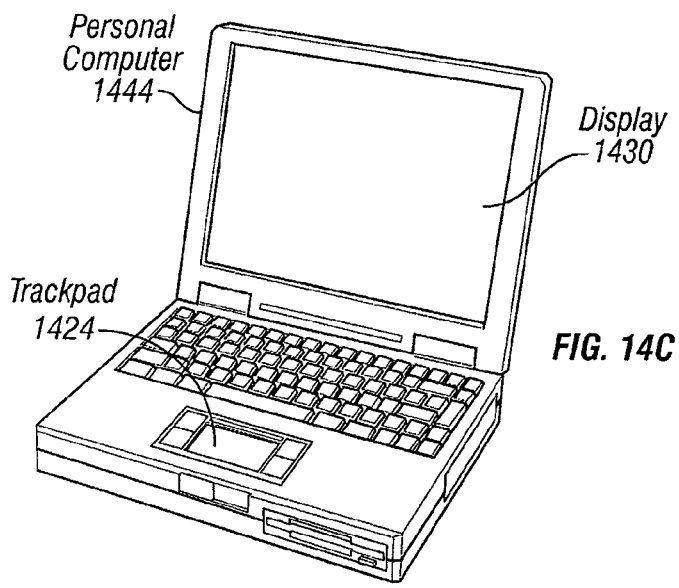
FIG. 14c illustrates exemplary personal computer that can include a touch sensor panel according to the various embodiments described herein.

FIG. 14c illustrates an example personal computer 1444 that can include touch sensor panel (trackpad) 1424 and display 1430, the touch sensor panel and/or display of the personal computer (in embodiments where the display is part of a touch screen) including an analog front end design according to the various embodiments described herein.

While various embodiments have been described above, it should be understood that they have been presented by way of example only, and not by way of limitation. Likewise, the various diagrams may depict an example architectural or other configuration for the disclosure, which is done to aid in understanding the features and functionality that can be included in the disclosure. The disclosure is not restricted to the illustrated example architectures or configurations, but can be implemented using a variety of alternative architectures and configurations. Additionally, although the disclosure is described above in terms of various exemplary embodiments and implementations, it should be understood that the various features and functionality described in one or more of the individual embodiments are not limited in their applicability to the particular embodiment with which they are described. They instead can be applied alone or in some combination, to one or more of the other embodiments of the disclosure, whether or not such embodiments are described, and whether or not such features are presented as being a part of a described embodiment. Thus the breadth and scope of the present disclosure should not be limited by any of the above-described exemplary embodiments.

What is claimed is:

1. An analog front end for receiving a sense signal from a touch sensor, comprising:
    a transimpedance amplifier;
    a feedback resistor coupled to an input of the transimpedance amplifier and to an output of the transimpedance amplifier; and
    a bandpass filter coupled to the output of the transimpedance amplifier;
    wherein a gain of the bandpass filter is adjustable to increase noise headroom.

2. The analog front end of claim 1, wherein the bandpass filter has a programmable center frequency.

3. The analog front end of claim 1, further comprising:
    an analog to digital converter coupled to the output of the bandpass filter.

4. The analog front end of claim 3, wherein the analog to digital converter is a sigma-delta analog to digital converter.

5. The analog front end of claim 3, further comprising:
    an anti-aliasing filter coupled between the output of the bandpass filter and the analog to digital converter.

6. The analog front end of claim 5, wherein a cut-off frequency of the anti-aliasing filter can be adjusted based on a selected center frequency of the bandpass filter as to optimize bandpass filter roll-off.

7. The analog front end of claim 1, further comprising:
    at least one multiplexor coupled to the input of the transimpedance amplifier configured to multiplex a plurality of sense signals to one analog front end.

8. The analog front end of claim 1, wherein the touch sensor is part of a computing system.

9. The analog front end of claim 1, wherein the bandpass filter has a passband gain of at least 6 dB.

10. A method for receiving a sense signal from a touch sensor, comprising:
    amplifying an incoming signal using a transimpedance amplifier having a feedback resistor coupled to an input of the transimpedance amplifier and to an output of the transimpedance amplifier; and
    filtering an output of the transimpedance amplifier using a bandpass filter having a programmable center frequency; and
    adjusting a gain of the bandpass filter to increase noise headroom.

11. The method of claim 10, further comprising:
    digitizing an output of the bandpass filter to enable digital demodulation.

12. The method of claim 11, wherein the analog to digital converter is a sigma-delta analog to digital converter.

13. The method of claim 10, further comprising:
    attenuating noise by performing anti-aliasing filtering of an output of the bandpass filter.

14. The method of claim 13, wherein a cut-off frequency of the anti-aliasing filtering can be adjusted based on the programmable center frequency so as to optimize bandpass filter roll-off.

15. The method of claim 10, further comprising:
    multiplexing a plurality of analog inputs to one dedicated channel to be input to the transimpedance amplifier.

16. The method of claim 10, wherein the touch sensor controller is part of a computing system.

17. The method of claim 10, wherein the bandpass filter has a passband gain of at least 6 dB.

18. A controller for a touch sensor, comprising:
a pre-amplifier;
a feedback resistor coupled to an input of the pre-amplifier, an output of the pre-amplifier and a virtual ground;
at least one capacitor coupled to the input of the pre-amplifier and the virtual ground;
a sigma-delta analog to digital converter coupled to the output of the pre-amplifier; and
a feedback circuit coupled between an output of the sigma-delta analog to digital converter and the input of the pre-amplifier to provide variable gain adjustment and bandpass filter response.

19. The controller of claim 18, wherein the sigma-delta analog to digital converter is of a second order or higher.

20. The controller of claim 18, wherein two capacitors are coupled to the input of the pre-amplifier, with at least one capacitor coupled to virtual ground and at least one capacitor has a variable capacitance.

21. A controller for a touch sensor, comprising:
a pre-amplifier, the input of which is coupled to a virtual ground; and
a sigma-delta analog to digital converter coupled to the output of the pre-amplifier, wherein the sigma-delta analog to digital converter has bandpass filter response, with one or a plurality of feedback paths to the input of the pre-amplifier, which is held at virtual ground.

22. The controller of claim 21, wherein the bandpass filter response is realized with a resonator.

23. The controller of claim 21, wherein the sigma-delta analog to digital converter is of a second order or higher.

24. The controller of claim 21, further comprising:
a digital demodulator coupled to the output of the sigma-delta analog to digital converter.

25. An analog front end for receiving a sense signal from a touch sensor, comprising:
a biquad bandpass filter including a virtual ground input for rejecting stray capacitance from the touch sensor; and
an analog to digital converter (ADC) coupled to the biquad bandpass filter.

26. The analog front end of claim 25, where the biquad bandpass filter has at least one of a programmable center frequency, gain and Q.

27. The analog front end of claim 25, where the ADC is a sigma-delta convertor.

28. The analog front end of claim 25, where the biquad bandpass filter is a tow-thomas biquad bandpass filter.

* * * * *